United States Patent
Sweatt et al.

(10) Patent No.: US 6,285,497 B1
(45) Date of Patent: *Sep. 4, 2001

(54) DIFFRACTIVE ELEMENT IN EXTREME-UV LITHOGRAPHY CONDENSER

(75) Inventors: William C. Sweatt, Albuquerque, NM (US); Avijit Ray-Chaudhuri, Livermore, CA (US)

(73) Assignee: EUV LLC, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/615,795

(22) Filed: Jul. 13, 2000

Related U.S. Application Data

(62) Division of application No. 09/130,224, filed on Aug. 6, 1998, now Pat. No. 6,118,557.

(51) Int. Cl.$^7$ .............. G02B 5/08; G02B 5/18; G02B 5/10; G03B 27/54; G21K 5/00
(52) U.S. Cl. .......... 359/351; 359/570; 359/572; 359/858; 359/859; 359/900; 378/34; 355/67
(58) Field of Search .................. 359/350, 351, 359/355, 387, 566, 570, 571, 572, 576, 851, 857, 858, 859, 900; 355/67; 378/34

(56) References Cited

U.S. PATENT DOCUMENTS

| | | |
|---|---|---|
| 4,798,446 | 1/1989 | Hettrick . |
| 4,915,463 | 4/1990 | Barbee, Jr. ............... 359/568 |
| 5,138,490 | 8/1992 | Hohberg et al. ......... 359/570 |
| 5,339,346 | 8/1994 | White ....................... 378/34 |
| 5,361,292 | 11/1994 | Sweatt .................... 378/34 |
| 5,439,781 | 8/1995 | MacDowell et al. ..... 378/34 |
| 5,512,759 | 4/1996 | Sweatt .................... 378/34 |
| 5,631,721 | 5/1997 | Stanton et al. ........... 359/569 |
| 5,815,249 | 9/1998 | Nishi et al. .............. 355/67 |
| 5,848,119 | 12/1998 | Miyake et al. ........... 378/34 |
| 6,002,520 | 12/1999 | Hoch et al. .............. 359/565 |

FOREIGN PATENT DOCUMENTS

| | | |
|---|---|---|
| 59-155920 | 9/1984 | (JP) . |
| 61-141135 | 6/1986 | (JP) . |
| 404120717A | 4/1992 | (JP) . |

OTHER PUBLICATIONS

Tanya E. Jewell, "Reflective systems design study for soft x–ray projection lithography", J. Vac. Sci. Technol. B, 8 (6), pp. 1519–1523, Nov./Dec. 1990.*

Schmiedeskamp, B. et al., "Electron–beam–deposited Mo/Si and MoxSiy/Si multilayer x–ray mirrors and gratings", *Optical Engineering*, 33(4) 1314–1321, 1994.

Fukuda, H. et al., "New optics design methodology using diffraction grating on spherical mirrors for soft x–ray projection lithography", *J. Vac. Sci. Technol. B*, 13 (2), 366–370, 1995.

Patent Abstract of Japan, Publication No. 61141135, Jun. 28, 1986.

Patent Abstract of Japan, Publication No. 59155920, Sep. 5, 1984.

Sweeney et al., "EUV Optical Design for a 100 nm CD Imaging System", SPIE, vol. 3331, pp. 2–10, 1998.

* cited by examiner

*Primary Examiner*—Audrey Chang
*Assistant Examiner*—John Juba, Jr.
(74) *Attorney, Agent, or Firm*—Burns, Doane, Swecker & Mathis, L.L.P.

(57) ABSTRACT

Condensers having a mirror with a diffraction grating in projection lithography using extreme ultra-violet significantly enhances critical dimension control. The diffraction grating has the effect of smoothing the illumination at the camera's entrance pupil with minimum light loss. Modeling suggests that critical dimension control for 100 nm features can be improved from 3 nm to less than about 0.5 nm.

19 Claims, 8 Drawing Sheets

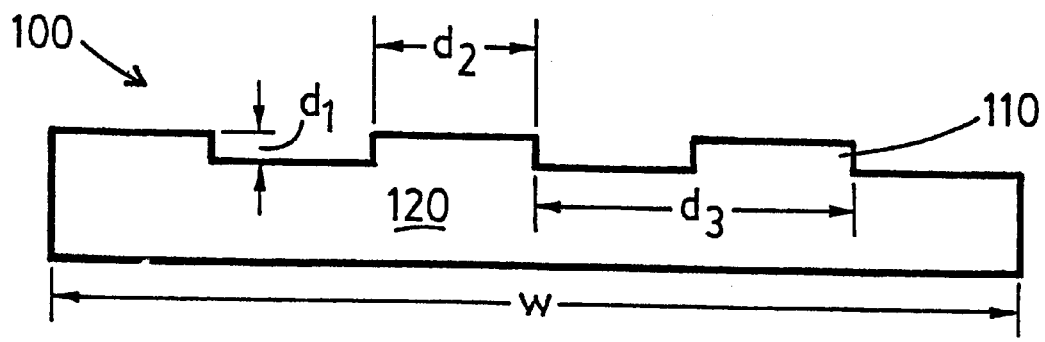
FIG._1A.
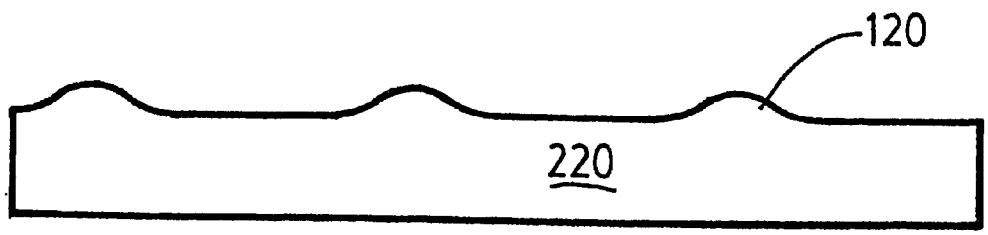
FIG._1B.

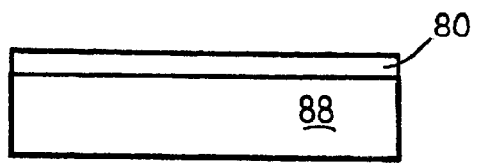
FIG._2A.
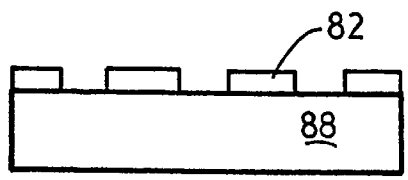
FIG._2B.
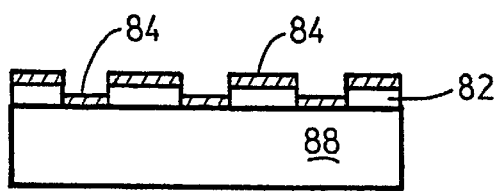
FIG._2C.
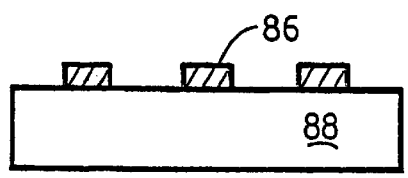
FIG._2D.
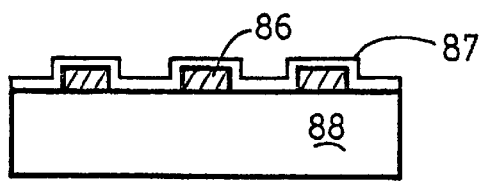
FIG._2E.

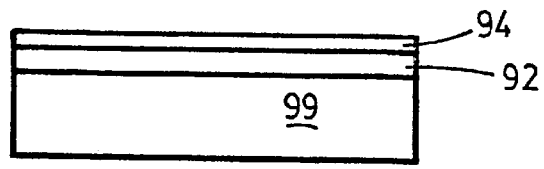
FIG._3A.
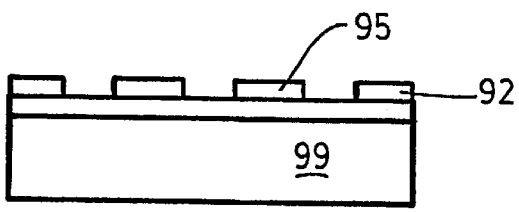
FIG._3B.
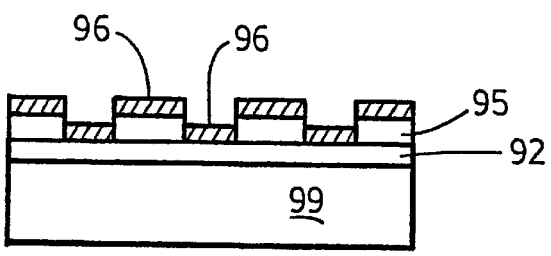
FIG._3C.
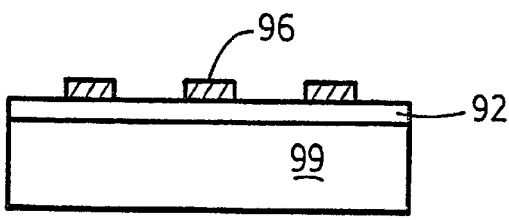
FIG._3D.

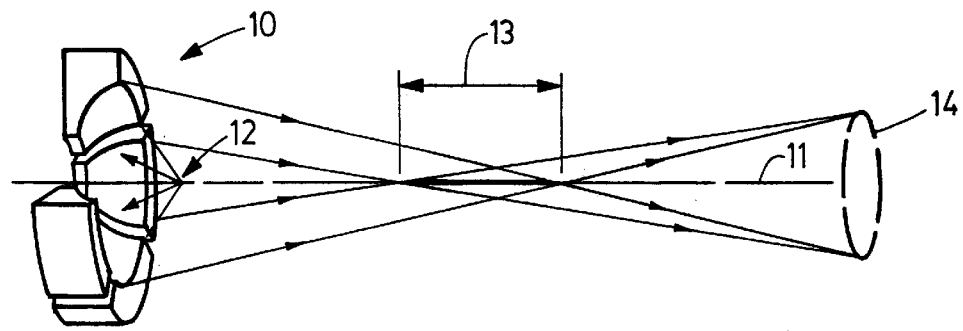
FIG._4.
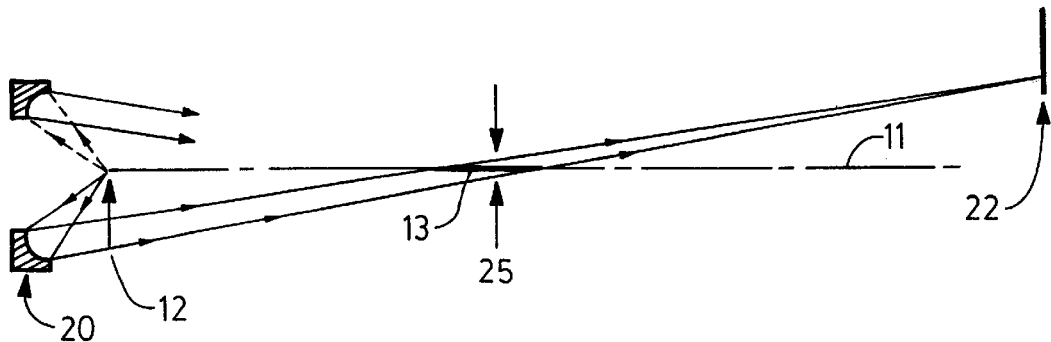
FIG._5A.
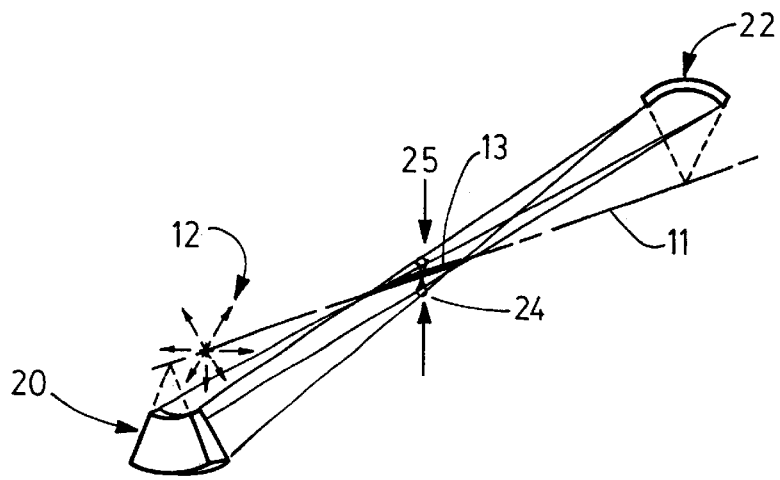
FIG._5B.

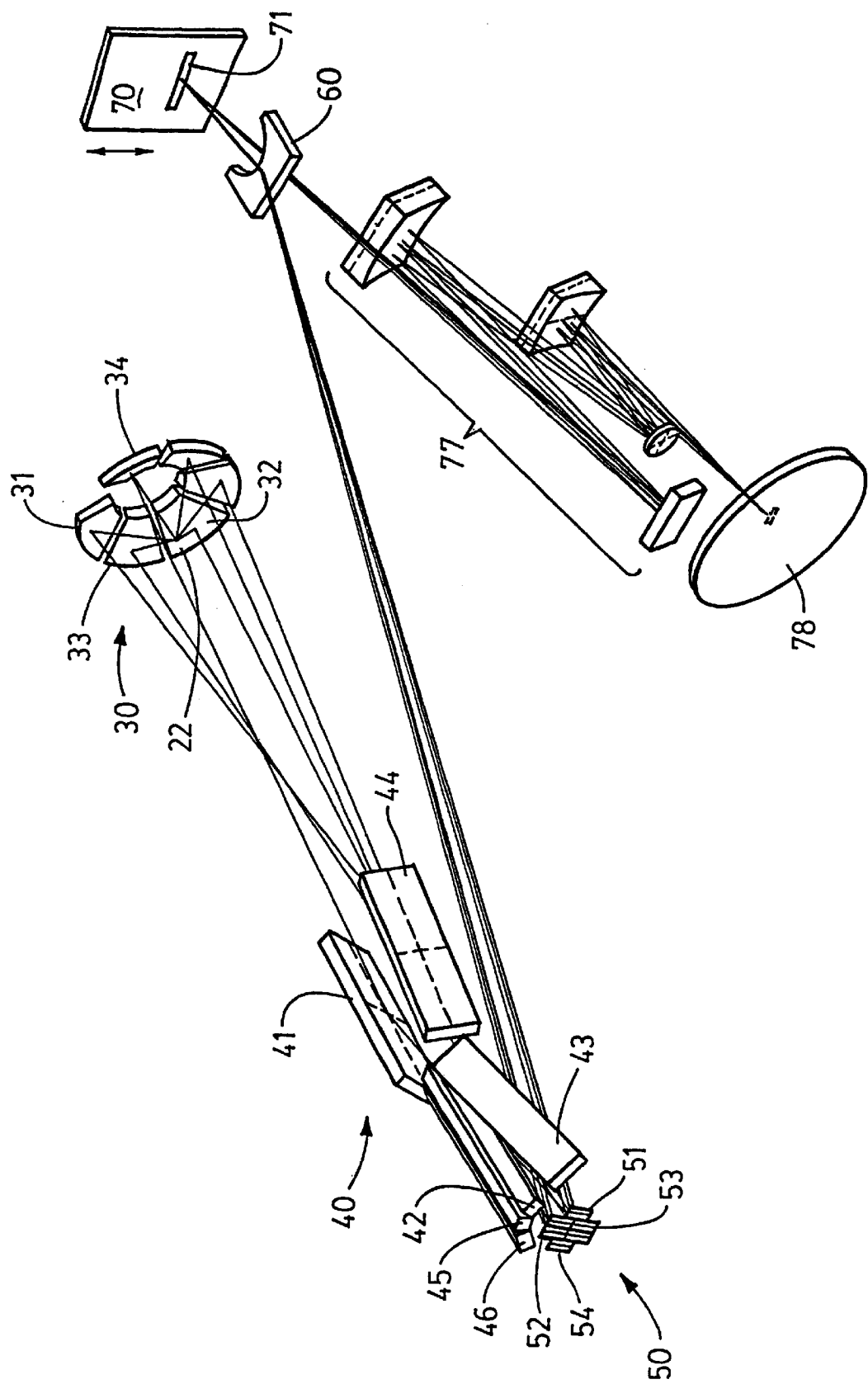
FIG._6A.

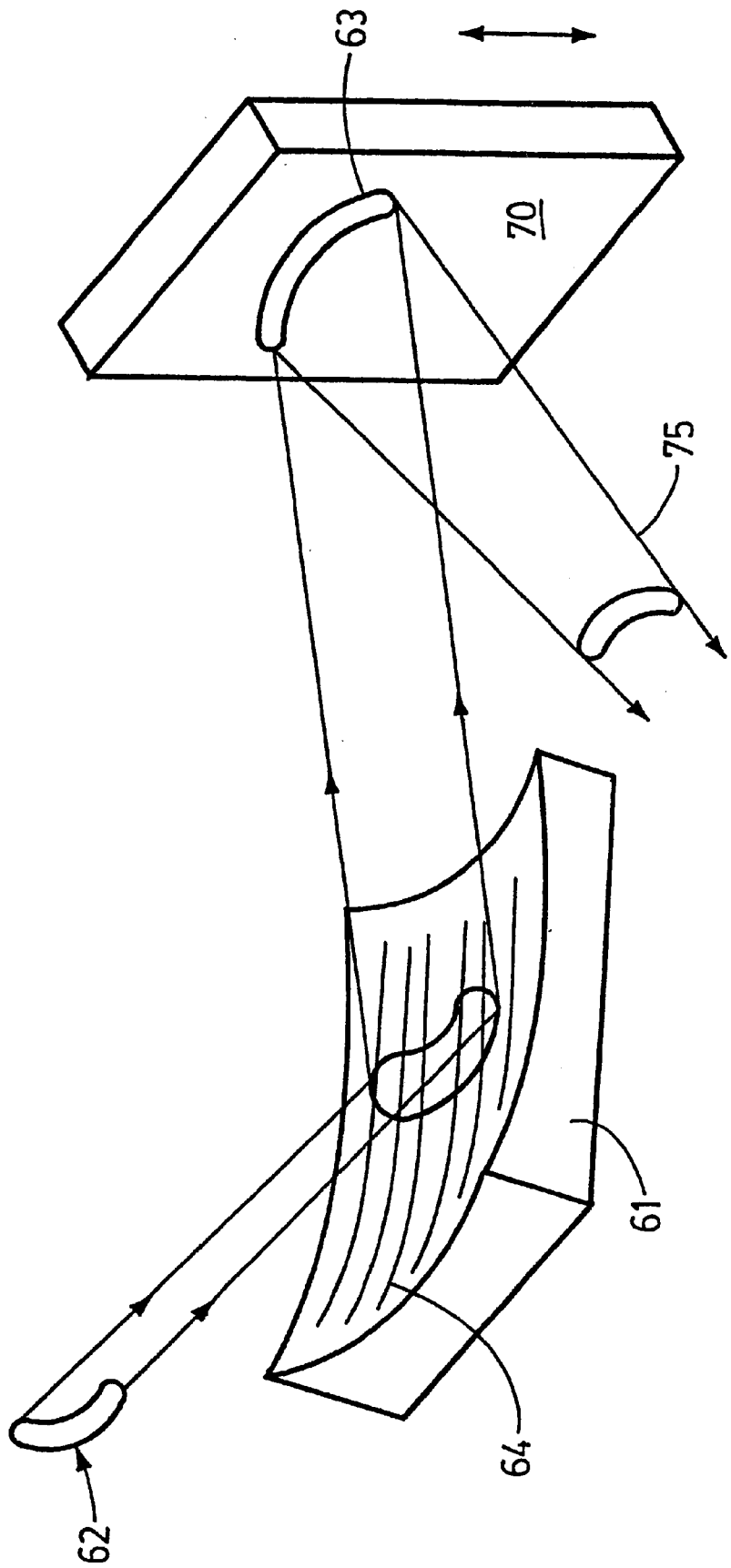
FIG._6B.

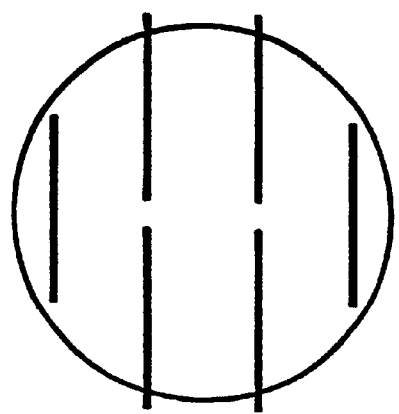
FIG._7.
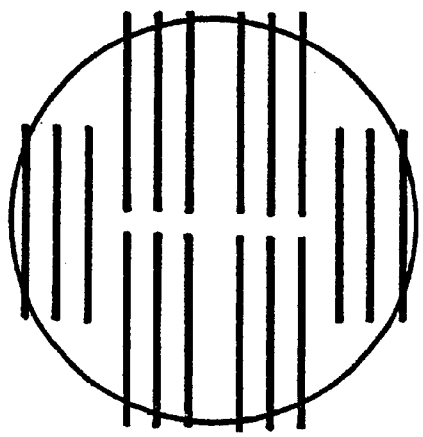
FIG._8.

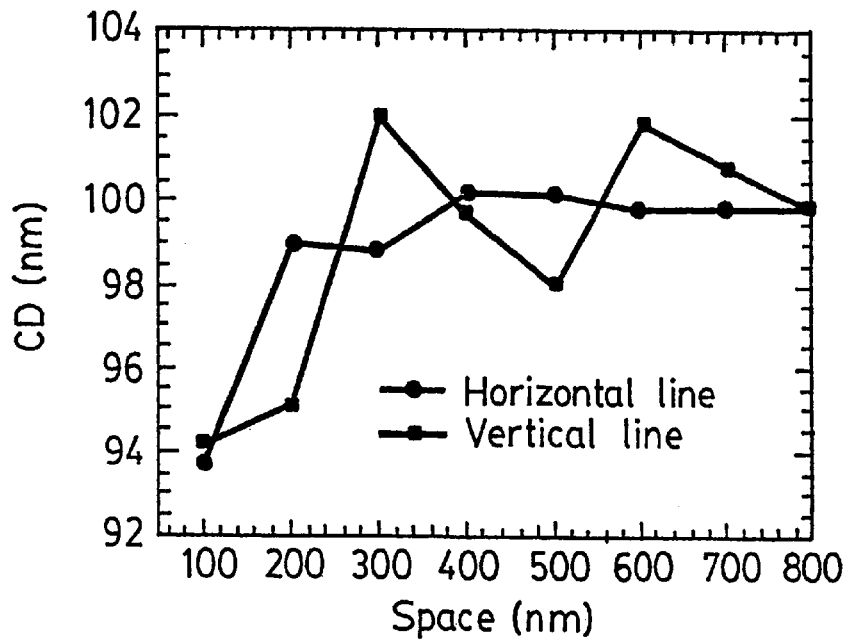
FIG._9A.
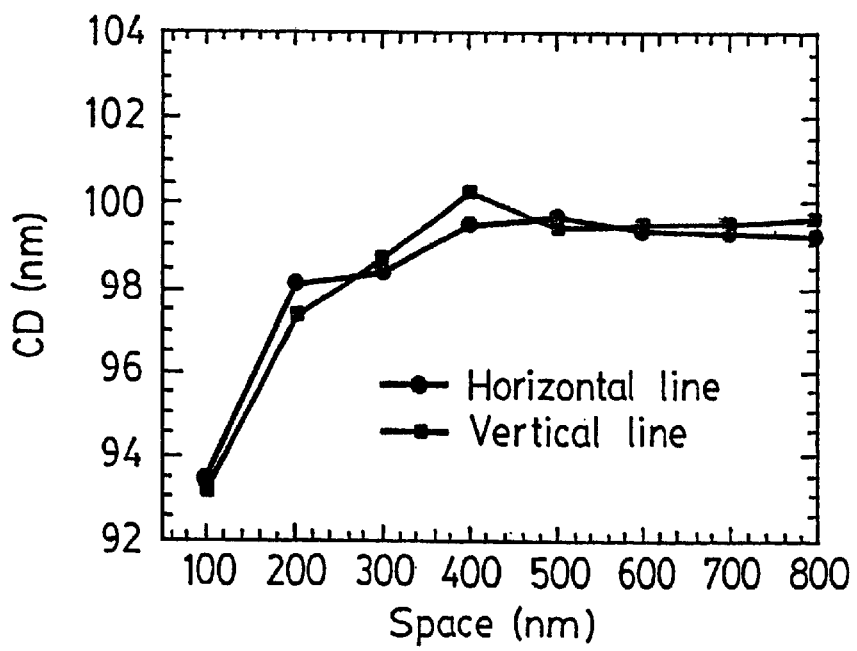
FIG._9B.

DIFFRACTIVE ELEMENT IN EXTREME-UV LITHOGRAPHY CONDENSER

This application is a divisional of application Ser. No. 09/130,224, filed Aug. 6, 1998, now U.S. Pat. No. 6,118,577.

The U.S. Government has a paid-up license in this invention and the right in limited circumstances to require the patent owner to licence others on reasonable terms as provided for by the terms of Contract No. DE-AC04-94AL85000 awarded by the Department of Energy.

FIELD OF THE INVENTION

This invention relates to condensers that collect radiation and deliver it to a ringfield. More particularly, this condenser collects radiation, here soft x-rays, from either a small, incoherent source or a synchrotron source and couples it to the ringfield of a camera designed for projection lithography.

BACKGROUND OF TE INVENTION

In general, lithography refers to processes for pattern transfer between various media. A lithographic coating is generally a radiation-sensitized coating suitable for receiving a projected image of the subject pattern. Once the image is projected, it is indelibly formed in the coating. The projected image may be either a negative or a positive of the subject pattern. Typically, a "transparency" of the subject pattern is made having areas which are selectively transparent, opaque, reflective, or non-reflective to the "projecting" radiation. Exposure of the coating through the transparency causes the image area to become selectively crosslinked and consequently either more or less soluble (depending on the coating) in a particular solvent developer. The more soluble (i.e., uncrosslinked) areas are removed in the developing process to leave the pattern image in the coating as less soluble crosslinked polymer.

Projection lithography is a powerful and essential tool for microelectronics processing. As feature sizes are driven smaller and smaller, optical systems are approaching their limits caused by the wavelengths of the optical radiation. "Long" or "soft" x-rays (a.k.a. Extreme UV) (wavelength range of $\lambda$=100 to 200 Å ("Angstrom") are now at the forefront of research in efforts to achieve the smaller desired feature sizes. Soft x-ray radiation, however, has its own problems. The complicated and precise optical lens systems used in conventional projection lithography do not work well for a variety of reasons. Chief among them is the fact that there are no transparent, non-absorbing lens materials for soft x-rays and most x-ray reflectors have efficiencies of only about 70%, which in itself dictates very simple beam guiding optics with very few surfaces.

One approach has been to develop cameras that use only a few surfaces and can image with acuity (i.e., sharpness of sense perception) only along a narrow arc or ringfield. Such cameras then scan a reflective mask across the ringfield and translate the image onto a scanned wafer for processing. Although cameras have been designed for ringfield scanning (e. g., Jewell et al., U.S. Pat. No. 5,3 15,629 and Offner, U.S. Pat. No. 3,748,015), available condensers that can efficiently couple the light from a synchrotron source to the ringfield required by this type of camera have not been fully explored. Furthermore, full field imaging, as opposed to ringfield imaging, requires severely aspheric mirrors in the camera. Such mirrors cannot be manufactured to the necessary tolerances with present technology for use at the required wavelengths.

The present state-of-the-art for Very Large Scale Integration ("VLSI") involves chips with circuitry built to design rules of 0.25 $\mu$m. Effort directed to further miniaturization takes the initial form of more fully utilizing the resolution capability of presently-used ultraviolet ("UV") delineating radiation. "Deep UV" (wavelength range of $\lambda$=0.3 $\mu$m to 0.1 $\mu$m), with techniques such as phase masking, off-axis illumination, and step-and-repeat may permit design rules (minimum feature or space dimension) of 0.18 $\mu$m or slightly smaller.

To achieve still smaller design rules, a different form of delineating radiation is required to avoid wavelength-related resolution limits. One research path is to utilize electron or other charged-particle radiation. Use of electromagnetic radiation for this purpose will require x-ray wavelengths.

Two x-ray radiation sources are under consideration. One source, a plasma x-ray source, depends upon a high power, pulsed laser (e.g., a yttrium aluminum garnet ("YAG") laser), or an excimer laser, delivering 500 to 1,000 watts of power to a 50 $\mu$m to 250 $\mu$m spot, thereby heating a source material to, for example, 250,000° C., to emit x-ray radiation from the resulting plasma. Plasma sources are compact, and may be dedicated to a single production line (so that malfunction does not close down the entire plant). Another source, the electron storage ring synchrotron, has been used for many years and is at an advanced stage of development. Synchrotrons are particularly promising sources of x-rays for lithography because they provide very stable and defined sources of x-rays.

Electrons, accelerated to relativistic velocity, follow their magnetic-field-constrained orbit inside a vacuum enclosure of the synchrotron and emit electromagnetic radiation as they are bent by a magnetic field used to define their path of travel. Radiation, in the wavelength range of consequence for lithography, is reliably produced. The synchrotron produces precisely defined radiation to meet the demands of extremely sophisticated experimentation. The electromagnetic radiation emitted by the electrons is an unavoidable consequence of changing the direction of travel of the electrons and is typically referred to as synchrotron radiation. Synchrotron radiation is comprised of electromagnetic waves of very strong directivity emitted when electron or positron particles, traveling within the synchrotron at near light velocity, are deflected from their orbits by a magnetic field.

Synchrotron radiation is emitted in a continuous spectrum or fan of "light", referred to as synchrotron emission light, ranging from radio and infrared wavelengths upwards through the spectrum, without the intense, narrow peaks associated with other sources. Synchrotron emission light has characteristics such that the beam intensity is high, and the divergence is small so that it becomes possible to accurately and deeply sensitize a photolithographic mask pattern into a thickly applied resist. Generally, all synchrotrons have spectral curves similar to the shape shown in FIG. 1 of Cerrina et al. (U.S. Pat. No. 5,371,774) that define their spectra. The particular intensity and critical photon energy will vary among different synchrotrons depending upon the machine parameters.

Parameters describing the size of the source of synchrotron radiation and the rate at which it is diverging from the source are of importance. Because the electrons are the source of synchrotron radiation, the cross section of the electron beam defines the cross section of the source. Within the plane of the orbit, the light is emitted in a broad, continuous fan, which is tangent to the path of the electrons.

Because of the relatively small height and width of the electron beam, any point along its length acts as a point source of radiation, providing crisp images at an exposure plane which is typically 8 meters or more away from the ring. At a distance of 8 meters, however, a 1 inch wide exposure field typically collects only 3.2 milli-radians ("mrad") of the available radiation. There are two ways to improve the power incident at a photo-resist: either shorten the beamline or install focusing elements. The use of focusing elements has the potential advantage of collecting x-rays from a very wide aperture and providing a wide image with a very small vertical height. However, the use of focusing elements results in a loss of power at each element because of low reflectivity of the x-rays and introduces aberrations. Synchrotron radiation is emitted in a horizontal fan. The small vertical divergence of the synchrotron radiation implies that a wide horizontal mirror, or a plurality of smaller parallel systems, can accept a large fan of light, whose outputs are added together at the mask plane.

A variety of x-ray patterning approaches are under study. Probably the most developed form of x-ray lithography is proximity printing. In proximity printing, object:image size ratio is necessarily limited to a 1:1 ratio and is produced much in the manner of photographic contact printing. A fine-membrane mask is maintained at one or a few microns spacing from the wafer (i.e., out of contact with the wafer, thus, the term "proximity"), which lessens the likelihood of mask damage but does not eliminate it. Making perfect masks on a fragile membrane continues to be a major problem. Necessary absence of optics in-between the mask and the wafer necessitates a high level of parallelism (or collimation) in the incident radiation. X-ray radiation of wavelength $\lambda \leq 16$ Å is required for 0.25 $\mu$m or smaller patterning to limit diffraction at feature edges on the mask.

Use has been made of the synchrotron source in proximity printing. Consistent with traditional, highly demanding, scientific usage, proximity printing has been based on the usual small collection arc. Relatively small power resulting from the 10 mrad to 20 mrad arc of collection, together with the high-aspect ratio of the synchrotron emission light, has led to use of a scanning high-aspect ratio illumination field (rather than the use of a full-field imaging field).

Projection lithography has natural advantages over proximity printing. One advantage is that the likelihood of mask damage is reduced, which reduces the cost of the now larger-feature mask. Imaging or camera optics in-between the mask and the wafer compensate for edge scattering and, so, permit use of longer wavelength radiation. Use of extreme ultra-violet radiation (a.k.a., soft x-rays) increases the permitted angle of incidence for glancing-angle optics. The resulting system is known as extreme UV ("EUVL") lithography (a.k.a., soft x-ray projection lithography ("SXPL")).

A favored form of EUVL is ringfield scanning. All ringfield optical forms are based on radial dependence of aberration and use the technique of balancing low order aberrations, i.e., third order aberrations, with higher order aberrations to create long, narrow illumination fields or annular regions of correction away from the optical axis of the system (regions of constant radius, rotationally symmetric with respect to the axis). Consequently, the shape of the corrected region is an arcuate or curved strip rather than a straight strip. The arcuate strip is a segment of the circular ring with its center of revolution at the optic axis of the camera. See FIG. 4 of U.S. Pat. No. 5,315,629 for an exemplary schematic representation of an arcuate slit defined by width, W, and length, L, and depicted as a portion of a ringfield defined by radial dimension, R, spanning the distance from an optic axis and the center of the arcuate slit. The strip width is a function of the smallest feature to be printed with increasing residual astigmatism, distortion, and Petzval curvature at distances greater or smaller than the design radius being of greater consequence for greater resolution. Use of such an arcuate field allows minimization of radially-dependent image aberrations in the image. Use of object:image size reduction of, for example, 5:1 reduction, results in significant cost reduction of the, now, enlarged-feature mask.

It is expected that effort toward adaptation of electron storage ring. synchrotron sources for EUVL will continue. Economical high-throughput fabrication of 0.25 $\mu$m or smaller design-rule devices is made possible by use of synchrotron-derived x-ray delineating radiation. Large angle collection over at least 100 mrad will be important for device fabrication. Design of collection and processing optics for the condenser is complicated by the severe mismatch between the synchrotron light emission pattern and that of the ringfield scan line.

Sweatt, U.S. Pat. No. 5,512,759, discloses a condenser for collecting and processing illumination from a synchrotron source and directing the illumination into a ringfield camera designed for photolithography. The condenser employs a relatively simple and inexpensive design, which utilizes spherical and flat mirrors that are easily manufactured. The condenser employs a plurality of optical mirrors and lenses, which form collecting, processing, and imaging optics to accomplish this objective.

Sweatt, U.S. Pat. No. 5,361,292, discloses a condenser that includes a series of aspheric mirrors on one side of a small, incoherent source of radiation. If the mirrors were continuously joined into a parent mirror, they would image the quasi point source into a ring image with a diameter of a few tens of centimeters at some distance, here some number of meters. Since only a relatively small arc (about 60 degrees) of the ring image is needed by the camera, the most efficient solution is to have about five 60° beams, all of which are manipulated such that they all fall onto the same arc needed by the camera. Also, all of the beams must be aimed through the camera's virtual entrance pupil. These requirements are met in two steps.

First, the beams are individually rotated and translated, as necessary, using mirrors so that they overlap at the ringfield and pass through the real entrance pupil without interfering with each other. The second step is to image this real entrance pupil into the camera's virtual entrance pupil using a powered imaging mirror. This places the corrected, combined images of the mirrors into the proper position for use by the camera. This system may be configured in a variety of ways.

Despite the advantages in condenser designs for projection lithography, the art is in search of techniques that enhance critical dimension (CD) control.

Condenser designs such as those disclosed by Sweatt are quite efficient in that they collect about 1 steradian of light from a small point incoherent source or 20° or 30° from a synchrotron and pass it through the ringfield and into the entrance pupil. However, the illumination pattern in the entrance pupil is far from uniform causing a large CD error.

The 3-nm CD error typically obtained with 100-nm features using current techniques is quite large and requires that the masks be designed and then modified to remove these predictable errors. This mask modification step is an iterative procedure where the mask geometry corrections are estimated and then the corrected mask must be modeled. This step adds expense and uncertainty to the function of the completed chips, even possibly requiring a redesign and the fabrication of a new set of masks.

In particular, condenser improvements are sought that would permit mask designers to lay out the features on the mask essentially exactly as they are to be on the wafer. This will reduce the mask layout costs and make extreme-UV lithography more attractive.

SUMMARY OF THE INVENTION

The present invention is based in part on the discovery that employing condensers having a correcting mirror with a diffraction grating in projection lithography significantly increases the uniformity of the illumination in the entrance pupil and thus enhances critical dimension control. The diffraction grating has the effect of smoothing the illumination at the camera's entrance pupil with minimum light loss. Modeling suggests that critical dimension control for 100 nm features can be improved from 3 nm to less than about 0.5 nm.

Accordingly, in one aspect, the invention is directed to a condenser system having a set of mirrors for collecting extreme ultra-violet radiation from a radiation source that forms a source image, and having correcting mirrors which are capable of translating or rotating, or both, one or more beams from said set of mirrors and which are capable of modifying the convergence of the one or more beams from said set of mirrors and/or the size of the source image, wherein at least one of the correcting mirrors has a diffraction grating on its surface.

In another aspect, the invention is directed to a condenser system for use with a ringfield camera including:

a small diameter source of radiation;

at least two substantially equal radial segments of a parent aspheric mirror, each having one focus at the radiation source and a line focus filling the object field of the camera at the radius of the ringfield and each producing a beam of radiation; and a corresponding number of sets of correcting mirror means which are capable of translation or rotation, or both, such that all of the beams of radiation pass through the real entrance pupil of the camera to form a coincident curved line (or arc) image at the ringfield radius, wherein one of the correcting mirrors of each set, or preferably a mirror that is common to all sets, from which the radiation emanates has a diffraction grating on its surface.

In a further aspect, the invention is directed to a condenser system for collecting synchrotron radiation from a synchrotron source that emits a fan of synchrotron emission light in the plane of the source and for illuminating the ringfield of camera, including:

collecting means, positioned about the periphery of a synchrontron source, for collecting a plurality of synchrotron light beams emitted from a fan of synchrontron emission light and for transforming the plurality of synchrotron light beams into a plurality of arc-shaped light beams, each one of the plurality of arc-shaped light beams having an arc-shaped cross-section;

processing means, succeeding said collecting means, for rotating and directing the plurality of arc-shaped light beams toward the real entrance pupil of a camera and for positioning a plurality of substantially parallel arc-shaped light beams at the real entrance pupil of the camera; and imaging means, succeeding said processing means, for converging the substantially parallel arc-shaped light beams, for transmitting the plurality of the substantially parallel arc-shaped light beams to a reflective mask and then into the virtual entrance pupil of the camera, and for illuminating the ringfield of the camera wherein the imaging means comprises at least one mirror that has a diffraction grating on its surface.

In another aspect, the invention is directed to a process for fabricating integrated devices that includes at least one element having a dimension $\leq 0.25$ $\mu$m by projection lithography that employs a condenser system having the inventive diffraction grating.

In one embodiment, the diffraction grating is written on a mirror that is metal-coated and nearly cylindrical and has an average angle of incidence of 80°. This mirror precedes the mask plane by about 200 mm. Preferably, the diffraction grating comprises an essentially uniform frequency, two-level, phase only, reflecting binary optical element with a 50% duty cycle. For EUV with a wavelength of 13.4 nm, the grating period is preferably about 4.5 microns and the step height is about 12.2 nm Considering the 80° angle of incidence, the step height introduces a phase step of about 0.3 $\lambda$ between the steps and the spacings or grooves in the grating. This leaves about 30% of the power in the zero order (the specular reflection), diffracts about 28% into each of the first orders ($\pm 1$) and leaves about 14% in the higher orders. The 4.5 micron grating period moves each of the first order diffracted beams laterally in the camera's entrance pupil. This motion is equal to about 12% of the entrance pupil radius. This condenser is typically mated with a camera with a numerical aperture that ranges from about 0.07 to 0.3 and preferably of about 0.10 to 0.20.

BRIEF DESCRIPTION OF THE DRAWINGS

FIGS. 1A and 1B are each a partial cross-sectional view of a correcting mirror having a diffraction grating on its surface;

FIGS. 2A–2E and 3A–3D illustrate methods for fabricating diffraction gratings;

FIG. 4 is a side-view of one embodiment of a condenser system without correcting mirrors, showing the reimaging of the point source into a ringfield with the images crossing over the center line of the system;

FIGS. 5A and 5B are another side-view showing the geometries of the mirrors and the beams in more detail for this embodiment;

FIG. 6A is a perspective view of an embodiment of the system showing the beams going through its set of correcting mirrors showing the interaction of the beam with the camera;

FIG. 6B illustrates a mirror with a diffraction grating;

FIGS. 7 and 8 illustrate 6 channel and 18 channel illuminations, respectively, formed on the camera pupil; and FIGS. 9A and 9B are graphs of horizontal and vertical CD (100 nm nominal line) vs. spacing derived from simulation results using a conventional condenser and a condenser having a mirror with the diffraction grating, respectively.

DETAILED DESCRIPTION OF THE INVENTION

The following terms of art are defined before providing a description and discussion of the present invention.

A. Terms of Art

Synchrotron Source: X-ray radiation source constructed from a storage ring providing for relativistic electrons or positrons confined by magnetic fields to a repeating orbital path.

Illuminating Radiation: A collection of photons, each of which has energy capable of exposing photoresist incident on and producing an illumination field on a mask. The illumination field is characterized by its intensity, direction, divergence, and spectral width.

EUV: Extreme Ultra-Violet Radiation, also known as soft x-rays, with wavelength in the range of 50 to 700 Å.

IX Camera: A camera of the class disclosed in U.S. Pat. No. 3,748,015.

5X Camera: A camera of the class disclosed in U.S. Pat. No. 5,315,629.

Spherical Mirror: A mirror, either concave or convex, whose surface forms part of a sphere. Although the present invention employs the use of spherical mirrors for convenience and economical concerns, it is intended that other mirrors be covered by the present invention, such as toroidal, and conic section (e.g., parabolic, hyperbolic, general aspheric, elliptical, cylindrical, etc.), mirrors that may be substituted for spherical mirrors within tolerable industry standards (including those with minor flaws or aberrations), etc.

Flat Mirror: A mirror whose surface is nearly flat within manufacturing tolerances. Although the present invention employs the use of flat mirrors, it is intended that the present invention be easily modified by those of ordinary skill in the art to employ the use of other shaped mirrors where flat mirrors are disclosed in the following discussion.

Divergence: As used by itself, the term refers to a cone of rays diverging from an image point.

Convergence: As used by itself, the term refers to a cone of light converging toward an image point, a.k.a. focusing.

Condenser: Optical system for collecting the source radiation, for processing the source radiation to produce a ringfield illumination field and for illuminating the mask.

Collecting Optics (or Collector): The optics within the condenser responsible for collecting the source radiation. The collector has a focus.

Processing Optics: The optics within the condenser that is responsible for orienting and positioning the collected beams, and modifying their convergence.

Binary Optical Element (BOE): A diffracting structure fabricated by lithographic processes. These are typically "phase-only", which means that the grating only affects the phase of the incident light, not the intensity. BOEs typically have 2, 4, 8, or 16 levels requiring 1, 2, 3, or 4 masks or write cycles, respectively.

Imaging Optics (or Camera Optics): The optics following the condenser and mask, in addition to the collecting and processing optics, responsible for delivering mask-modulated radiation to the wafer, i.e., the camera optics.

Camera Pupil: Real or virtual aperture that defines an opening through which source radiation from any object point must enter the camera,. Its physical size is that of an image of the real limiting aperture of the camera.

Aperture Stop: The point at which the principal rays cross; the stop serves to limit the size of the cone angles of the ray bundles converging toward the image from any point in the object field.

Lens: The term is used in this description to define any optical element which causes radiation to converge or diverge. "Lenses," in soft x-ray or EUV systems, are generally reflecting and are sometimes referred to as "mirrors." Contemplated lenses may be multi-faceted or may be non-faceted, i.e., continuous, e.g., of ellipsoidal or other curvature. The convergence or divergence is a result of action analogous to that of a transmission optical lens.

Full-field Exposure: Simultaneous (rather than sequential) exposure of all subareas of an image field. In its derivation, the term refers generally to a complete circuit pattern such as that of an entire chip. In this description, it is used to refer to any low-aspect ratio rectilinear pattern region, whether of an entire or partial pattern. Contemplated partial patterns may be stitched together by step-and-repeat to constitute the entire pattern.

Diffraction Grating: Diffraction is a scattering phenomenon resulting from the wave nature of light and some perturbation in the field of propagation. A diffraction grating is typically an ordered roughness on a mirror face. The scattering produced by said roughness can be controlled by ordering the roughness. For example, if the roughness is produced by a set of parallel lines,(ridges, grooves, or other structures with a two-dimensional cross section), then the diffraction or scattering will be perpendicular to the lines, and if the lines are all identical and equally spaced, the radiation will be diffracted only in a few discrete angles. This is commonly known as a linear diffraction grating.

B. The Invention

FIG. 1A is a partial cross sectional view of correcting mirror 100 having a two4evel diffraction grating on the surface onto which EUV radiation is directed. Although the mirror substrate is shown to be generally flat, it is understood that the mirror can have a curved reflecting surface. Indeed, in one embodiment, the mirror has an essentially cylindrical surface. The grating includes a plurality of mesa-like structures 110 with each mesa preferably having essentially vertical sides. Preferably, the mesas have (1) a step height d, that ranges from about 1.4 nm to about 15 nm, more preferably from about 1.8 nm to about 2.4 nm, (2) a step width $d_2$ that ranges from about 0.5 $\mu$m to about 11 $\mu$m and more preferably from about 1 $\mu$m to about 3.5 $\mu$m, and (3) a period $d_3$ that ranges from about 1 $\mu$m to 14 $\mu$m and more preferably from about 2 $\mu$m to about 7 $\mu$m. As is apparent, the diffraction grating can be constructed so that the individual dimensions for each of $d_1$, $d_2$, and $d_3$ vary. However, typically the diffraction grating will be constructed so that each of the dimensions for $d_1$, $d_2$, and $d_3$ is constant among the plurality of mesa-like structures on the mirror surface. In a preferred embodiment, the diffraction grating is characterized as having an essentially uniform frequency which means that the period $d_3$ is essentially constant.

The diffraction grating typically is constructed on the surface of mirrors having a clear aperture surface area of at least 0.5 cm$^2$ and preferably from about 4 cm$^2$ to 30 cm$^2$. Referring to FIG. 1A, the width W of the mirror substrate typically ranges from about 3 cm to 15 cm and preferably from about 10 cm to 13 cm.

In a preferred arrangement, the phase grating is characterized by a period of about 4.5 $\mu$m and a step height of about 12 nm when the angle of incidence of the 13.4 nm wavelength EUV radiation on the diffraction grating is about 80°. An additional way of expressing the preferred grating features is that it is a one-step (binary) phase grating having a duty cycle of about 25% to about 75% and more preferably about 50% that introduces a phase change (between the ground level and the top surface of the mesa) of 90° to 126° (0.25 Å to 0.35 Å) and preferably about 112° (0.31 $\mu$).

The values of step height, mesa width and period presented above are based on light that is incident on the mirror near to the mirror normal; that is, within about 15° of the normal so the cosine of the angle is nearly one. Those skilled in the art can readily modify these limits when the angle of incidence is outside this range.

Alternatively, the diffraction grating may have non-uniform spacing which means that $d_3$ is not uniform and/or the diffraction grating may have more than one level which means that $d_1$ is not uniform throughout. In addition, the diffraction grating can exhibit a continuous or varying profile as shown in FIG. 1B where, in this example, the mesas 120 on correcting mirror 220 form a surface with an undulating, smooth contour. Diffraction gratings with this structure will tend to produce wider scattering, i.e., thereby creating higher order sidebands, than those in FIG. 1A The diffraction grating is typically linear in that the correcting mirror comprises a series of equal width, equally spaced, parallel mesas covering at least a portion of the correcting mirror surface where EUV radiation is incidental to the surface. In a preferred embodiment, a substantially cylindrical mirror has a linear diffraction grating wherein the "lines" in the grating are approximately parallel to the axis of the cylinder. It is understood that a diffraction grating need not be uniform, i.e., the phase step could be varied and the period and the duty cycle could both vary across the surface of the cylinder.

The correcting mirror 100 preferably includes a substrate 120 that is made of a material having a low expansion coefficient and high thermal conductivity. Particularly suited material are low expansion glass which are commercially available as CERVIT™ and ULE™.

Various techniques can be employed to fabricate the grating. In any fabrication scenario, it is particularly preferred to begin with a superpolished mirror or substrate with the proper radii in the two directions (e.g., $r_1 \approx 600$ mm and $r_2 \approx 9000$ mm concave) and configured for condenser applications.

FIGS. 2A–2E illustrate a process for fabricating a diffraction grating on a mirror. (As is apparent, the dimensions of the mesas have been exaggerated for illustrative purposes.) Referring to FIG. 2A, photoresist layer 80 is applied onto mirror substrate 88 before being exposed and developed using conventional techniques to form the photoresist pattern 82 as shown in FIG. 2B. Subsequently, conformal layers 84 of suitable material are deposited over the photoresist pattern as shown in FIG. 2C. Suitable materials tend to deposit in an amorphous form and can produce smooth top surfaces if the mesa layers are less than 20 nm thick. For example, Si, SiO, Mo, Be, Rh, Ru, and composites thereof can be employed.

Removal of the photoresist material by ashing produces mesa structures 86 as shown in FIG. 2D. Finally, a reflective coating 87 is deposited over the entire structure to produce the inventive diffraction grating as shown in FIG. 2E. The reflective material preferably achieves at least about 65% and more preferably at least about 70% reflection. For example, Rh, Ru, and Si/Mo and Be/Mo multilayers can be employed depending on the anticipated angle of incidence. Rh and Ru are particularly suited for large angles of incidence, e.g., greater than about 80° and Si/Mo and Be/Mo multilayers are particularly suited for small angles of incidence, e.g, less than about 60°.

In another process for fabricating a diffracting mirror to be used at grazing incidence, a reflective layer 92 is initially formed on mirror substrate 99 before a photoresist layer 94 is applied onto the reflective layer as shown in FIG. 3A. Particularly preferred reflective materials include, for example, Rh and Ru which can achieve about 90% reflection at an angle of incidence of about 80°. Thereafter, the photoresist layer is exposed and developed to form photoresist pattern 95 as shown in FIG. 3B. Subsequently, a layer of reflective material 96, preferably comprising the same material as layer 92, is formed on the substrate as shown in FIG. 3C. Finally, removal of the remaining photoresist produces a diffractive grating having mesas 98 as shown in FIG. 3D.

Another method of fabricating the grating is to focus an ion beam to etch or erode away the valleys between the mesas, thus creating the mesa structures on the surface of the mirror. Several passes of the ion beam may be required to create the flat bottom required. Another method is to spin-coat a layer of photoresist or resist on the surface and thereafter create the desired pattern on the resist that corresponds to the grating by laser writing, projection imaging or holography. Using resist is particularly suited where the mirror has a curved concave surface since the centrifugal forces that move the resist outward on a spinning wafer increase with distance from the spin axis. Therefore, there should be more centrifugal force tending to spread the resist radially near the edges of the wafer where the resist has to overcome gravity. The resist spinner may have to be modified since the thickness of the mirror ($\approx 20$ mm) is larger than most wafers (1 mm to 1.5 mm thick).

Once the resist has been coated on the mirror surface, the pattern on the resist that corresponds to the linear grating can be formed by selective exposure to radiation using holography. One method entails interfering two point sources of laser light. Another method is to expose the grating using two interfering spherical beams or the like. Given that this is for condenser optics, larger tolerances are acceptable. It is estimated that the tolerance on the grating frequency is 1% to 2% of the nominal frequency. Furthermore, the fringes only need to be parallel to tolerance of a few milliradians and, finally, the duty cycle should have a tolerance of roughly 50%+3%, and it could vary from this by a little bit over the surface of the mirror.

Following exposure and development of the resist to form a pattern (e.g., 50% duty cycle pattern) on the substrate, the mesas are created by depositing SiO or, other suitable material such as silicon, chrome, or gold, in the pattern created. The resist is stripped away leaving the mesas and then multilayer reflective coating, e.g., Si/Mo, is deposited over the entire substrate to form a correcting mirror with a diffraction grating, or a metal coating of Rh or Ru.

The condensers having the inventive diffraction grating are particularly suited for use in projection lithography for fabricating integrated devices that comprise at least one element having a dimension of $\leq 0.25$ μm. The process comprises construction of a plurality of successive levels by lithographic delineation using a mask pattern that is illuminated to produce a corresponding pattern image on the device being fabricated, ultimately to result in removal of or addition of material in the pattern image regions. Typically, where lithographic delineation is by projection, the collected radiation is processed to accommodate imaging optics of a projection camera and image quality that is substantially equal in the scan and cross-scan directions, and smoothly varying as the space between adjacent lines varies. In a preferred embodiment, projection comprises ringfield scanning comprising illumination of a straight or arcuate region of a projection mask. In another preferred embodiment, projection comprises reduction ringfield scanning in which an imaged arcuate region on the image plane is of reduced size relative to that of the subject arcuate region so that the imaged pattern is reduced in size relative to the mask region.

The diffraction grating of the present invention can be employed in any condenser that collects soft x-rays for illuminating a ringfield camera. The source of the radiation may be from a small, incoherent source (e.g., plasma source)

or synchrotron source. Suitable condensers for collecting soft x-rays from plasma and synchrotron sources are described in U.S. Pat. Nos. 5,361,292 and 5,512,759, respectively, which are incorporated herein by reference. While the invention will be described in conjunction with a system employing a plasma source, it is understood that the diffraction grating is applicable to other condenser designs. One of the advances of the condenser illustrated herein is the ability to separate the light from a line or quasi point source at the entrance pupil into several separated lines or transform point foci that are still superimposed on each other at the ringfield radius, thus maximizing the collection efficiency of the condenser and smoothing out any inhomogeneities in the source optics.

As shown in FIG. 4, the illuminator or collecting mirrors are composed of six off-axis segments of an aspheric mirror, each 50 degrees wide, producing six beams which each cross over the system axis or centerline 11 as defined by the source and the center of the parent mirror. The parent aspheric mirror 10 images the "point" source 12 into a ring image 14. Therefore, its cross-section in the r-z plane is elliptical with one of the foci at the plasma source and the other at the ringfield radius. Each of the 50 degree mirror segments images the source into a 50 degree segment of the ring image.

FIGS. 5A and 5B show both a side view and an isometric view of the beam from one segment 20 of the aspheric mirror, with the isometric view rotated relative to the side view about a line 25 passing through the area of the beam having a smallest beam cross section. It shows the shape of the collector mirror 20, the arc image 22, and the bow-tie-shaped minimum beam cross-section 24, which is located at the center of the axial line focus. This design gives uniform illumination along the length of the arc 22.

The overall layout of this system is shown in FIG. 6A. The radiation is collected from the source 22 by mirror segments 30 which create arc images that are in turn rotated by roof mirror pairs illustrated collectively as 40 and 50. Beams of radiation reflected from mirrors 50 are reflected by a toric mirror 60 to deliver the six overlapped ringfield segments onto reflective mask 70. At least two segments of the parent mirror 30 are employed. The parent mirror can be typically partitioned into 2 to 12 segments and preferably into 5 to 8 segments.

The diifraction grating is preferably located on mirror 60, but could also be located on another mirror located just upstream of the mask 70. The distance from the group of mirrors 50 defining the condenser's pupil to the grating should be 3 to 10 times as long as the distance from the grating to the mask. The arcuate image of the source 71 is somewhat blurred by the grating. This blurring is minimized when the aforementioned ratio of distances is large (nearing 10).

Were the condenser shown in FIG. 6A to be built without a grating on mirror 60, it would create six arc images that would be superimposed on the mask. Introducing the grating splits the intensity profile for the arc image into three parts that all have the same shape as the aforementioned intensity profile, though they will all be attenuated relative to it. For example, the +1, zero, and −1 orders could contain 28%, 30%, and 28% of the total power. The images associated with the +1 and −1 orders are shifted laterally, perpendicular to the scanned direction by small amounts relative to the undiffracted zero order, and the three form a slightly blurred image of the undiffracted arc.

Therefore, if the sum of the 6 arc images has a uniform, smooth intensity profile without the grating, it will also be smooth and uniform with the grating (except at the very ends of the arc image). By contrast, faceted mirrors or mirrors that vary on a macroscopic scale such as those described in McDowell, U.S. Pat. No. 5,439,781 are not appropriate for this application. The large facets create local variations in the intensity at the mask if the scatter plate is mounted near the mask, or if the faceted mirror is mounted nearer to the real entrance pupil, the arc image becomes badly smeared out.

An illustrative arc 71 is shown on mask 70. The system further includes a ringfield camera 77 having a set of mirrors which images the mask using said radiation onto wafer 78. As is apparent, the diffraction grating follows the real entrance pupil.

Mirror sets 40 and 50 act as a roof-mirror pairs that rotate and translate the arcs in the 6 channels so they overlap. As an example, mirror 31 creates an arc image and roof mirror pair 41 and 51 rotates the arc image to fit the slit image and translate it to the proper position. Similar arc images are created and processed by mirror combinations 32, 42, and 52, and so on. Mirrors 41, 42, and 43 are parts of different and unique channels; and mirrors 44, 45, and 46 are mirror images of mirrors 41, 42, and 43, respectively.

FIG. 6B illustrates a toroidally shaped mirror 61 with diffraction grating including a plurality of mesas 64 that are roughly parallel to the axis of the cylindrical (or elliptical) substrate. Specifically, a beam cross section 62 from the condenser is reflected from the surface of the mirror 61 to form a curved slit illumination 63 on moving mask 70. Beam 75 is propagated from the mask into the camera. The +1 orders are diffracted (roughly) along the length of the beam footprint 63 and would increase the length of the footprint by about 1%.

System efficiency is a function of the size of the source and the reflectivity of the mirrors. The collection efficiency depends on the Entendu of the whole optical system. The Entendu or Lagrange invariant derived from the theorm of conservation of energy and indicates that, for an unvignetted pencil of light, the product of image height and numerical aperture is the same at all image planes in the system. This leads to an equivalence between source parameters (diameter and collection angle) and camera parameters (ringfield width and numerical aperture). If one were to illuminate the ring field with only one beam, one could use the entire numerical aperture for it. However, with six beams one can only use about one sixth of the entrance pupil area for each beam. Thus, the camera parameters together with the 150 μm source size limit the beam collection angle to about 40 degrees in elevation (and by 6×50 degrees=300 degrees in azimuth). This results in a total collection efficiency of about 40% of the radiation into the hemisphere.

The transmission efficiency of the beam lines depends on the reflectivity of the mirrors. At 14 nm, the theoretically perfect reflectivities are about 55%, 90%, 65% and 90%, where the first number is the average reflectivity of the aspheric collector, the next is for the grazing-incidence flats the next for the mirror at the real entrance pupil, and the last is for the reimaging sphere. The product of these ideal reflectivities is about 30%, which means that theoretically, 20% of the soft x-rays from the source can be delivered to the mask. With real reflectivities, one can expect more on the order of 11% of the EUV radiated into a hemisphere to be delivered.

Each segment of the parent mirror is astigmatic, having different circumferential and tangential focal planes. The circumferential image is the on-axis line focus 13 shown in FIG. 5. This line is centered in the real entrance pupil, essentially giving Kohler illumination along the ring field. The tangential image 22 (in the r-z plane) is located at the ring field, giving critical illumination. In a normal, non-scanning system this would give intensity and image quality variations in the radial direction. However, the scanning integrates out these radial variations. Hence, one is left with the uniform image quality which can only be achieved with two-dimensional Kohler illumination in a non-scanned system.

Partial coherence in the illumination affects the image quality. In an incoherently illuminated optical system, small features are attenuated due to the fall-off of the modulation transfer function (ITF). Partial conherence can be introduced into the illumination to counter this attenuation. This normally done by underfilling the entrance pupil in a system with Kohler illumination. Put a different way, the source (which is usually a disk) is imaged into the entrance pupil, and this image is smaller than the pupil by a factor of a 0.6. This value of a is a reasonable compromise which amplifies the small features and does not add too much "ringing" to the larger features.

To demonstrate the effect of increasing the number of illumination channels in the pupil with the inventive diffraction grating, PROLITH/3D, a lithography simulation package from FINLE Technologies Inc., Austin, Tex., was utilized. For this simulation, the source of x-rays is a laser plasma that emits soft x-rays that have about a 14 nm wavelength. The diameter and height of the source is about 150 $\mu$m. The camera at the other end of the system images a 60 degree, 125 mm long by 5 mm wide ringfield onto the wafer at 4× reduction. The entrance pupil is 3.6 m behind the reflective object mask, and the numerical aperture of the camera is n.a.=0.10 at the wafer and 0.025 at the mask. The system employed for the simulation is shown in FIGS. 6A and 6B and described above. The diffraction grating was a two level reflective (binary) phase grating with a 50% duty cycle that leaves 30% of the power in the zero order and diffracts 30% into each of the first orders (+1 and −1 orders).

Aerial image calculations were performed for the nominal critical dimension of 100 nm line features. The spacing between adjacent lines was varied from 100–800 nm. Post-processing software was written to extract linewidths for a fixed exposure. The linewidth was computed for horizontal and vertical features. The exposure which gave the nominal CD at 800 nm spacing was utilized for all features.

FIG. 7 shows the 6 channel illumination at the camera pupil for the condenser system without the diffraction grating. The circle indicates the boundary of a convention illumination of a 0.7. FIG. 8 shows an 18 channel approximation to the illumination at the camera pupil for the condenser system with the diffraction grating. As is apparent, the effect of a diffraction grating is that each of six beams are split into the zero and two first order diffraction sidebands forming 18 beams which enable the pupil fill to better emulate conventional illumination. The beams fill approximately 70% ($\sigma$=0.7) of the pupil diameter. Note that a small percentage of the flux will be diffracted into the third, fifth, and higher order sidebands.

FIG. 9A shows simulation results using the condenser system without the grating (6 channels), when imaging 100 nm horizontal and vertical lines at different line spacings. As the spacing is adjusted, a CD variation as much as 4.0 nm is observed between horizontal and vertical lines. This difference is due to the large difference in coherence in the orthogonal directions.

FIG. 9B shows simulation results using the condenser system with the diffraction grating (18 channels), when imaging 100 nm horizontal and vertical lines at different line spacings. As is apparent, CD variation between horizontal and vertical lines is reduced by utilizing the phase grating to effectively increase the number of channels and reduce the coherence variation in the orthogonal directions. The location of the channels are important in terms of emulating a uniform conventional illumination. The grating pitch applied to mirror 60 of FIG. 6A is preferably adjusted to provide a distribution of the 18 channels in the pupil that emulates conventional illumination. The maximum CD variation is now reduced to less than 1 nm.

It is possible to make a number of modifications to the embodiments. These include, for example, changing the shape of the diffraction grating and changing the number of illumination channels. In particular, it is apparent from FIG. 8 that most of the energy in the diffraction pattern should remain in a rectangle that is about 0.45D tall and between about 0.15D to 0.25D wide if the disk is to be largely filled. With a simple, two phase level, uniform frequency direct grating one can keep approximately 90% of energy in the zero and +1 orders as described in the preferred embodiment.

Furthermore, diffraction gratings with (a) non-uniform spacing, (b) a grating having more than one level and/or (c) continuous profiles one can fill the above-mentioned rectangle more uniformly with, for example, the zero, ±1, ±2 and ±3 orders, while using roughly the same amount of power in each instance. If the diffraction hologram is varied in both the horizontal directions of FIG. 8, the procedure can also smooth out the line foci; however, increasing the height of the mesa could waste power. In addition, a more complicated binary optical element with, for instance, 16 phase levels will be harder to make and will have more step edges which will scatter light. Furthermore, the superpolished substrate is more difficult to maintain at all phase levels.

In addition, to simulate annular illumination one could reduce the height of the rectangles to about 0.20D to 0.30D and set the width to about the same value. Moreover, one could use more collection channels to produce, for example, eight rectangles roughly arranged in an annulus with an average diameter of perhaps 0.8D.

Finally, quadrapole illumination could be achieved with, for example, 4, 8, or 12 channels. With 4 channels, the rectangles should be approximately square with a height of about 0.2D to 0.3D. These squares would be located in the upper left, upper right and lower left and right zones of the entrance pupil. With 8 channels, 2 rectangles would make each square.

Another preferred system employs a laser plasma source that emits soft x-rays where the diameter and height of the source is about 150 $\mu$m. The camera at the other end of the system images a 50 degree, 100 mm long by 4 mm wide ringfield onto the wafer at 4× reduction. The entrance pupil is 3.6 m behind the reflective object mask, and the numerical aperture of the camera is n.a.=0.10 at the wafer and 0.025 at the mask.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A process for fabricating a device comprising at least one element having a dimension of less than or equal to 0.25 micron which comprises the steps of:

providing a source of extreme ultra-violet (EUV) radiation;

providing a condenser system succeeding the source wherein the condenser system has a set of mirrors for collecting the EUV radiation and transforming the EUV radiation into one or more beams and has correcting mirrors which are capable of translating or rotating, or both, one or more beams from said set of mirrors, wherein at least one of the correcting mirrors, or a mirror that is common to all sets, has a diffraction grating on its surface and wherein the diffraction grating comprises an essentially uniform frequency, phase only reflecting binary optical element that has at least two levels and wherein the condenser system produces substantially parallel arc-shaped light beams that are transmitted to a reflective mask pattern and then reflected therefrom to produce corresponding pattern image regions on the device being fabricated; and constructing one or more levels in the device being fabricated by removing or adding materials in the pattern image regions on the device being fabricated.

2. The process of claim 1 wherein the diffraction grating is a two-level binary optical element.

3. The process of claim 1 wherein the diffraction grating has about a 50% duty cycle.

4. The process of claim 1 wherein the diffraction grating has a step height which introduces a phase step of between about 90° to 126° between lines and spaces of the grating.

5. The process of claim 1 wherein the phase grating is characterized by a period of about 1 $\mu$m to 14 $\mu$m and a step height of about 1.4 nm to 15 nm.

6. The process of claim 1 wherein the phase grating is characterized by a period of about 4.5 $\mu$m and a step height of about 12 nm.

7. The condenser system of claim 1 wherein the condenser system comprises a mirror that is common to said correcting mirrors that has a diffraction grating on its surface.

8. A process for fabricating a device comprising at least one element having a dimension of less than or equal to 0.25 micron which comprises the steps of:

providing a small diameter source of extreme ultra-violet (EUV) radiation;

providing a condenser system succeeding the source wherein the condenser system comprises:

(i) at least two substantially equal radial segments of a parent aspheric mirror, each having one focus at the radiation source and a line focus filling the object field of a ringfield camera at the radius of the ringfield and each producing a beam of radiation; and (ii) a corresponding number of sets of correcting mirror means which are capable of translation or rotation, or both, such that all of the beams of radiation pass through the real entrance pupil of the camera and form a coincident arc image at the ringfield radius, wherein one of the correcting mirrors of each set, or a mirror that is common to said sets of mirrors, from which the radiation emanates has a diffraction grating on its surface and wherein the diffraction grating comprises an essentially uniform frequency, linear, phase only reflecting binary optical element that has at least two levels wherein the condenser system produces substantially parallel arc-shaped light beams that are transmitted to a reflective mask pattern and then reflected therefrom to produce corresponding pattern image regions on the device being fabricated; and constructing one or more levels in the device being fabricated by removing or adding materials in the pattern image regions on the device being fabricated.

9. The process of claims 8 wherein the condenser system comprises a mirror that is common to said set of mirror has a diffraction grating on its surface.

10. The process of claim 8 wherein the diffraction grating is a two-level binary optical element.

11. The process of claim 8 wherein the diffraction grating comprises an essentially uniform frequency, linear, two-level, phase only reflecting binary optical element.

12. The process of claim 8 wherein the diffraction grating has about a 50% duty cycle.

13. The process of claim 8 wherein the diffraction grating has a step height which introduces a phase step of between about 90° to 126° between lines and spaces of the grating.

14. The process of claim 8 wherein the phase grating is characterized by a period of about 1 $\mu$m to 14 $\mu$m and a step height of about 1.4 nm to 15 nm.

15. The process of claim 8 wherein the phase grating is characterized by a period of about 4.5 $\mu$m and a step height of about 12 nm.

16. The process of claim 8 wherein the radiation source is a small diameter radiation source.

17. The process of claim 8 in which lithographic delineation is by projection, and in which collected radiation is processed to accommodate imaging optics of a projection camera and image quality that is substantially equal in the scan and cross-scan directions, and smoothly varying as the space between adjacent lines varies.

18. The process of claim 17 in which projection comprises ringfield scanning comprising illumination of a straight or arcuate region of a projection mask.

19. The process of claim 17 in which projection comprises reduction ringfield scanning in accordance with which an imaged arcuate region on the image plane is of reduced size relative to that of the subject arcuate region so that the imaged pattern is reduced in size relative to the mask region.

* * * * *